United States Patent
Yang et al.

(10) Patent No.: US 9,664,747 B2
(45) Date of Patent: May 30, 2017

(54) ELECTRONIC DEVICES WITH MAGNETIC SENSORS

(71) Applicant: Apple Inc., Cupertino, CA (US)

(72) Inventors: Henry H. Yang, Los Gatos, CA (US); Chiajen Lee, Irvine, CA (US); Shawn Xavier Arnold, San Jose, CA (US)

(73) Assignee: Apple Inc., Cupertino, CA (US)

( * ) Notice: Subject to any disclaimer, the term of this patent is extended or adjusted under 35 U.S.C. 154(b) by 346 days.

(21) Appl. No.: 13/788,541

(22) Filed: Mar. 7, 2013

(65) Prior Publication Data

US 2014/0062469 A1     Mar. 6, 2014

Related U.S. Application Data

(60) Provisional application No. 61/694,103, filed on Aug. 28, 2012.

(51) Int. Cl.
    *G01R 33/02*     (2006.01)
    *G01C 17/28*     (2006.01)

(52) U.S. Cl.
    CPC ............ *G01R 33/02* (2013.01); *G01C 17/28* (2013.01); *G01R 33/0206* (2013.01)

(58) Field of Classification Search
    CPC .................................................. G01R 33/0206
    See application file for complete search history.

(56) References Cited

U.S. PATENT DOCUMENTS

| | | | |
|---|---|---|---|
| 5,689,185 A * | 11/1997 | Widdershoven et al. | 324/252 |
| 7,206,154 B2 | 4/2007 | Lee et al. | |
| 7,400,142 B2 | 7/2008 | Greelish | |
| 7,589,523 B2 * | 9/2009 | Baak et al. | 324/207.24 |
| 7,737,678 B2 * | 6/2010 | Shoji | 324/117 R |
| 7,786,731 B2 * | 8/2010 | Cole | E21B 47/02224 324/326 |
| 7,795,826 B2 | 9/2010 | Inoue | |
| 8,169,215 B2 | 5/2012 | Kataoka et al. | |
| 8,198,864 B2 * | 6/2012 | Koch | G01R 31/3648 320/132 |
| 8,321,161 B1 * | 11/2012 | Bruno et al. | 702/57 |
| 8,390,283 B2 | 3/2013 | Mather et al. | |
| 8,698,776 B2 * | 4/2014 | Kurashima | 345/174 |

(Continued)

*Primary Examiner* — Alesa Allgood
(74) *Attorney, Agent, or Firm* — Treyz Law Group, P.C.; Joseph F. Guihan

(57) ABSTRACT

Electronic devices may be provided with magnetic sensors for detecting the Earth's magnetic field. The magnetic sensors may include thin magnetic sensors located in magnetically quiet regions of the device. The magnetic sensors may be attached to a device housing or a component such as a battery or a cover structure for a battery. The device may include unidirectional magnetic sensors aligned in three orthogonal directions or sensors with two or three magnetic sensor elements aligned in orthogonal directions. Magnetic field data from the three orthogonally aligned sensors or sensor elements may be combined to form directional compass data for the device. Each magnetic sensor may include one or more magnetic sensor elements for detecting the magnetic field and one or more shielded reference sensor elements for detecting environmental changes that can affect the magnetic sensor element. Reference sensor elements may be shared elements for multiple magnetic sensors elements.

15 Claims, 18 Drawing Sheets

(56) References Cited

U.S. PATENT DOCUMENTS

| | | | |
|---|---|---|---|
| 9,513,338 B2* | 12/2016 | Koch | G01R 31/3606 |
| 2004/0137275 A1* | 7/2004 | Jander et al. | 428/692 |
| 2005/0110167 A1* | 5/2005 | Ramakrishnan | H01L 23/49827 257/786 |
| 2005/0242805 A1* | 11/2005 | Honkura et al. | 324/249 |
| 2005/0288743 A1* | 12/2005 | Ahn | A61N 1/3787 607/61 |
| 2006/0076929 A1* | 4/2006 | Tatsumi | G01R 31/3651 320/132 |
| 2006/0132141 A1* | 6/2006 | Dougherty | B60L 11/1857 324/435 |
| 2011/0227569 A1* | 9/2011 | Cai et al. | 324/252 |
| 2011/0313696 A1* | 12/2011 | Wolf | H01M 10/48 702/63 |
| 2012/0062215 A1* | 3/2012 | Ide | B82Y 25/00 324/202 |
| 2012/0215471 A1* | 8/2012 | Koch | G01R 31/3648 702/63 |
| 2013/0151180 A1* | 6/2013 | Koch | 702/63 |

* cited by examiner

ELECTRONIC DEVICES WITH MAGNETIC SENSORS

This application claims priority to U.S. provisional patent application No. 61/694,103 filed Aug. 28, 2012, which is hereby incorporated by reference herein in its entirety.

BACKGROUND

This relates generally to electronic devices and, more particularly, to electronic devices with magnetic sensors.

Electronic devices such as portable computers are often provided with compasses and other electronic components. Compasses may be used to gather magnetic field data for the electronic device. For example, a Global Positioning System (GPS) device or cellular telephone may have a compass for orienting maps displayed to a user on an associated device display.

Other electronic components in an electronic device with a compass often generate local magnetic fields during operation of the other electronic components. These local magnetic fields can interfere with the proper operation of the compass.

It can therefore be difficult to provide accurate compass data, particularly in compact electronic devices in which compasses must be placed in close proximity to other electronic components.

It would therefore be desirable to be able to provide electronic devices with improved magnetic sensors.

SUMMARY

Electronic devices may be provided with magnetic sensors. The magnetic sensors may be used by the device for sensing the Earth's magnetic field. The device may include one or more magnetic sensors that are each used to sense one or more components of the Earth's magnetic field. For example, a device may include three separate magnetic sensors that are each oriented along a particular direction or magnetic sensors with two or three magnetic sensor elements oriented along orthogonal directions to gather magnetic field data for a particular orthogonal component of the magnetic field.

Magnetic field data from each sensor or sensor element may be combined to form compass data for the device that indicates a direction in which the device is oriented.

Each magnetic sensor may be placed in a location within a housing for the device that is magnetically quiet along a particular direction or directions associated with that sensor. Electronic components in the housing may generate local magnetic fields having first, second, and third orthogonal components. A magnetic sensor may, for example, be located in a region within the housing at which a component of the local magnetic fields that is aligned with the particular direction associated with that sensor is smaller than the orthogonal second and third components of the local magnetic fields.

Each magnetic sensor may include a substrate having circuitry for processing magnetic field data and a magnetic sensing element that is used to gather the magnetic field data.

The substrate in each magnetic sensor may be back-thinned so that thin magnetic sensors may be provided. The substrate and the magnetic sensor element may be encapsulated in a substrate material with conductive traces that route magnetic field signals from the substrate to additional circuitry in the device. The substrate material may be a flexible substrate material such as polyimide, a more rigid substrate material such as a glass-infused epoxy, or other suitable materials for electronic circuit fabrication.

Each magnetic sensor may include one or more orthogonally aligned magnetic sensor elements and one or more shielded reference sensor elements. A shielded reference sensor element may be coupled to the substrate and the conductive traces in substantially the same way as a magnetic sensor element and may have an additional magnetic shielding layer. The magnetic shielding layer may include mu-metal or other magnetic shielding material that prevents magnetically sensitive material in the reference sensor element from being exposed to external magnetic fields.

Magnetic sensor elements and reference sensor elements may be formed separately on a surface of the substrate, may be interleaved on the surface of the substrate, or may be partially or completely embedded within the substrate.

Further features of the invention, its nature and various advantages will be more apparent from the accompanying drawings and the following detailed description.

DETAILED DESCRIPTION

Electronic devices may be provided with one or more magnetic sensors and other electronic components. The magnetic sensors may include one or more unidirectional, bidirectional, or tri-directional magnetic sensors that are coupled to compass interface circuitry. The compass interface circuitry may be configured to convert raw magnetic field data from the magnetic sensors into directional compass data (also called compass data).

Other electronic components may include cameras, speakers, auto-focus lens mechanisms, camera flashes, Light Emitting Diodes (LEDs), processing circuitry such as central processing units, memory or other integrated circuits, Global Positioning System (GPS) circuitry, display circuitry, light-emitting display circuitry, display backlights, headphones, batteries, vibrators, actuators or other components.

The magnetic sensors may be located within the electronic device at locations where local magnetic fields generated by the other components are relatively small. The magnetic sensors may be thin magnetic sensors that are able to be placed in relatively low magnetic field regions of the electronic device that are too small to place a conventional compass chip. In this way, the electronic device may be provided with improved magnetic sensors.

Figure 1:
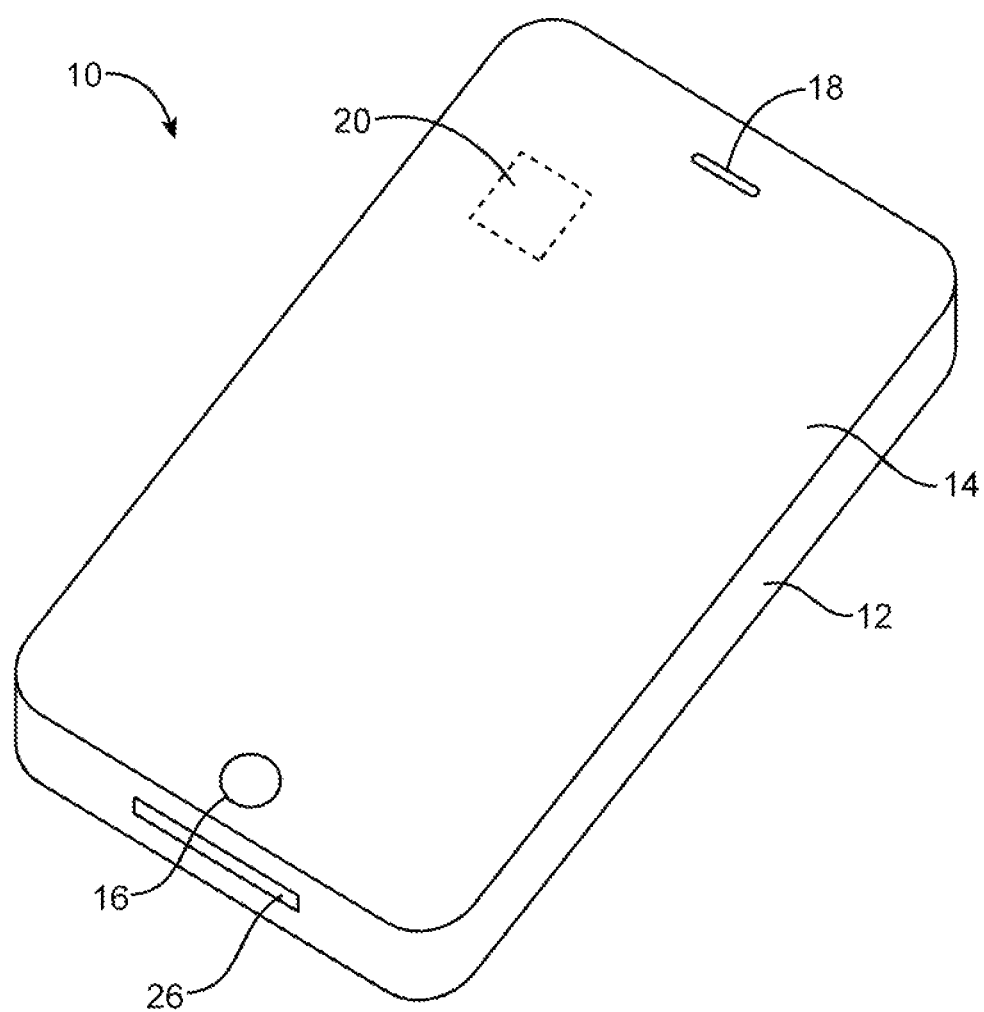
FIG. 1 is a perspective front view of an illustrative electronic device having magnetic sensors in accordance with an embodiment of the present invention.

An illustrative electronic device of the type that may be provided with magnetic sensors is shown in FIG. 1. Electronic device 10 of FIG. 1 may be a cellular telephone, media player, computer, handheld device, portable computer, tablet computer, Global Positioning System device, camera, gaming device, or other electronic equipment.

As shown in FIG. 1, device 10 may have a housing such as housing 12. Housing 12 maybe formed from plastic, metal, aluminum, carbon fiber composite material, other composites, glass, ceramics, other materials, or combinations of these materials. Housing 12 may be formed using a unibody construction in which housing 12 is substantially formed from a single structure (e.g., machined or cast metal, plastic, etc.) or may be formed from multiple pieces of material.

For example, housing 12 may include front and rear planar housing structures. The front planar housing structure may be a display cover layer for a display such as display 14. The display cover layer may be formed from glass and may sometimes be referred to as cover glass or display cover glass. The display cover layer may also be formed from other transparent materials such as plastic.

Device 10 may have input-output devices such as input-output ports, speakers, microphones, displays, status indicator lights, touch screens, buttons, proximity sensors, wireless circuitry, accelerometers, ambient light sensors, touch pads, and other devices for accepting input from a user or the surrounding environment of device 10 and/or for providing output to a user of device 10.

As shown in the illustrative configuration of FIG. 1, device 10 may, as an example, have one or more buttons 16 which may be used to gather user input. Buttons 16 may be based on dome switches or other switch circuitry. Buttons 16 may include button members that form push buttons (e.g., momentary buttons), slider switches, rocker switches, etc. Additional buttons such as buttons 16, additional data ports such as port 26, and additional input-output components such as speaker 18 may be provided in device 10 if desired. The example of FIG. 1 is merely illustrative.

Device 10 may have a flexible or rigid display such as display 14. Display 14 may be formed from multiple layers of material. These layers may include a touch sensor layer such as a layer on which a pattern of indium tin oxide (ITO) electrodes or other suitable transparent electrodes have been deposited to form a capacitive touch sensor array. These layers may also include a layer that contains an array of display pixels.

A rigid cover layer may have openings such as a circular openings for button 16 and a speaker port opening such as speaker port opening for speaker 18 (e.g., an ear speaker for a user). Device 10 may also have other openings (e.g., openings in display 14 and/or housing 12 for accommodating volume buttons, ringer buttons, sleep buttons, and other buttons, openings for an audio jack, data port connectors, removable media slots, etc.).

As shown in FIG. 1, device 10 may be provided with one or more internal magnetically sensitive devices such as magnetic sensor 20. One or more magnetic sensors such as magnetic sensor 20 may be arranged in magnetically quiet regions of the electronic device and coupled to compass interface circuitry.

Compass interface circuitry may be configured to combine magnetic field data from multiple sensors 20, generate directional compass data, and provide the compass data to other circuitry. Compass interface circuitry or other control circuitry in device 10 may be configured to store compass calibration data, may be configured to turn compass 30 on and off, may be configured to access information on the operational status of other electronic components, may be configured to apply corrections to compass data based on operational status information (also called status data, operational status data, etc.) associated with other electronic components, may be configured to combine these functions, or to perform any other compass related functions for device 10.

Figure 2:
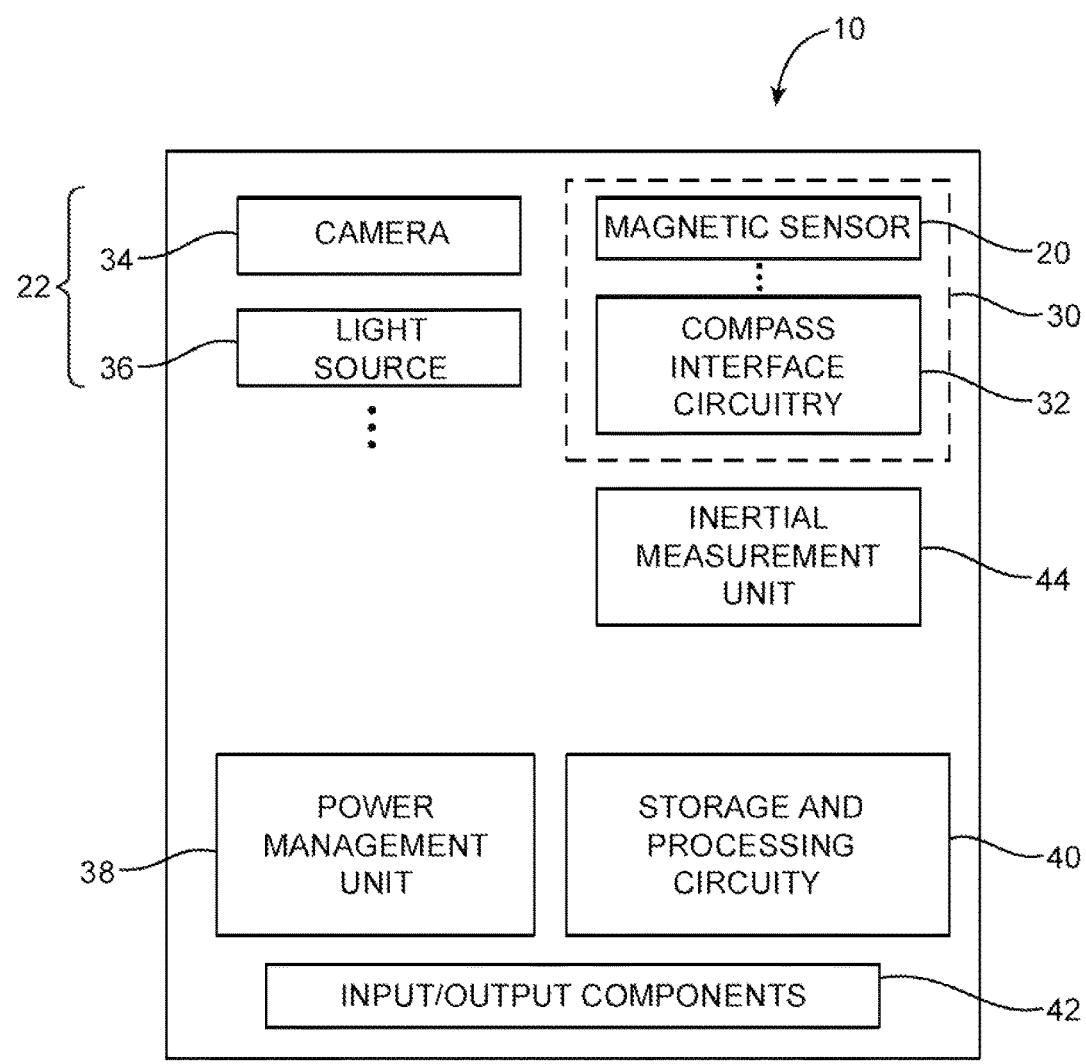
FIG. 2 is a diagram of illustrative circuitry and components for an electronic device having magnetic sensors in accordance with an embodiment of the present invention.

As shown in FIG. 2, magnetic sensors 20 may be combined with circuitry such as compass interface circuitry 32 to form compass 30. Compass interface circuitry 32 may be formed in part on magnetic sensors 20 and in part separately from sensors 20, or may be formed entirely separately from sensors 20.

Compass interface circuitry 32 may be configured to collect raw magnetic field data from sensors 20 and provide associated compass data to other control circuitry such as storage and processing circuitry 40 of device 10. Storage and processing circuitry 40 may be configured to deliver compass data from compass 30 to other software applications running on circuitry 40.

As shown in FIG. 2, device 10 may include other electronic components 22. Components 22 may include one or more cameras (e.g., a front-facing camera, a rear-facing camera, etc.), one or more light sources (e.g., a camera flash, an LED camera light, a flashlight, etc.) or other components that generate magnetic fields that may interfere with detection of the Earth's magnetic field. Sensors 20 may be positioned within device 10 in relatively magnetically quiet regions of the device (e.g., away from components 22 or near a battery for the device).

Device 10 may include control circuitry such as storage and processing circuitry 40. Storage and processing circuitry 40 may include storage such as hard disk drive storage, non-volatile memory (e.g., flash memory or other electrically-programmable-read-only memory configured to form a solid state drive), volatile memory (e.g., static or dynamic random-access-memory), etc.

Processing circuitry in storage and processing circuitry 40 and other control circuits such as control circuits in compass 30 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 40 may be used to run software on device 10, such as internet browsing applications, map applications, voice-over-internet-protocol (VoIP) telephone call applications, email applications, media playback applications, operating system functions, camera functions, camera based applications, light source functions, display functions, GPS operations, etc.

Some applications may use combined data from compass 30 and a positioning sensor such as inertial measurement unit (IMU) 44. Inertial measurement unit 44 may include one or more accelerometers, one or more gyroscopes, GPS circuitry, etc. for determining the location and position of device 10. Storage and processing circuitry 40 may be configured to operate IMU 44 in combination with compass 30 to provide position and location information to applications running on device 10.

Storage and processing circuitry 40 may be used to operate power management unit (PMU) 38 to supply electrical power to components 22 such as camera 34 and light source 36. Storage and processing circuitry 40 may be used to operate input/output components such as input/output components 42 and to process and store data input to device 10 using input/output components 42.

Input/output components 42 may include buttons or speakers such as button 16 and speaker 18 of FIG. 1. Input/output components 42 may include touch-sensitive portions of display 14, may include a keyboard, wireless circuitry such as wireless local area network transceiver circuitry and cellular telephone network transceiver circuitry, and other components for receiving input and supplying output. Components 22 may be internal to device 10 or may have portions that are visible on a portion of an exterior surface of device 10.

Control circuitry such as storage and processing circuitry 40 may include circuitry for interfacing with the resources of compass 30 (e.g., control circuitry of compass interface circuitry 32 may be considered to form part of storage and processing circuitry 40). For example, control circuitry 40 may be configured to run a compass interface software application that interfaces with compass 30.

Figure 3:
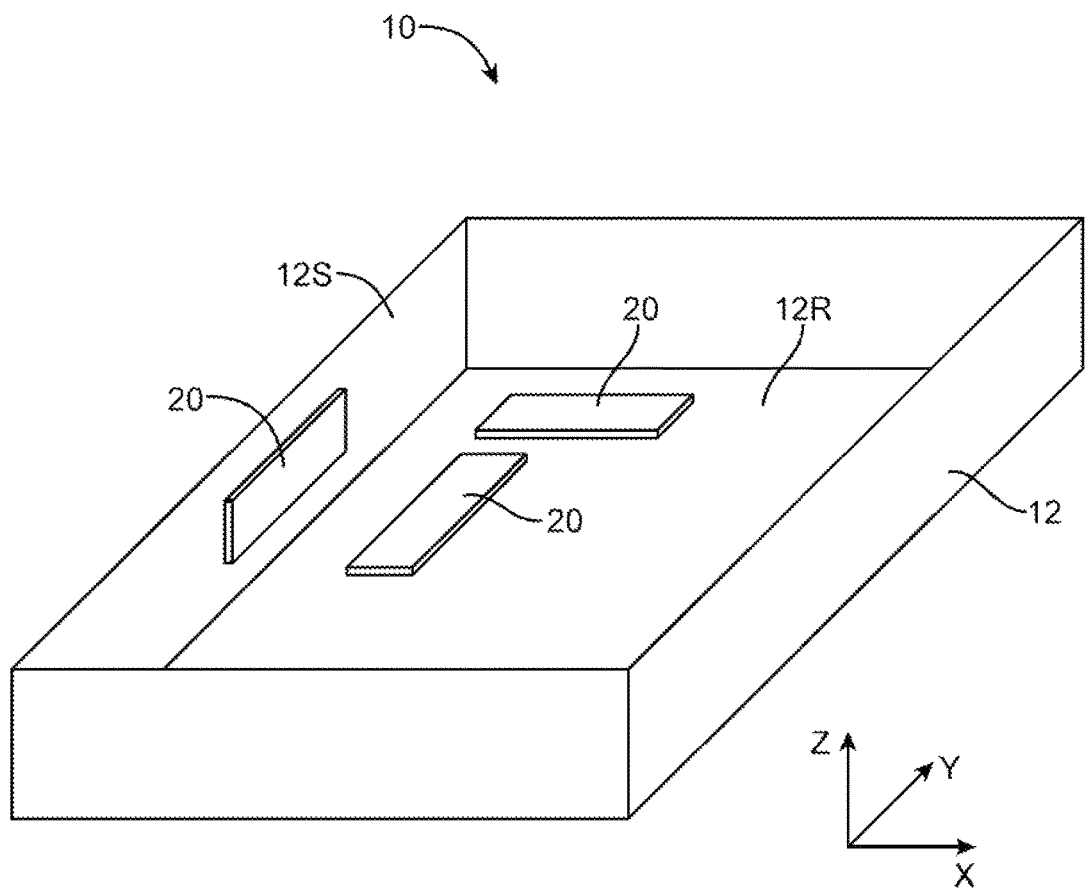
FIG. 3 is a perspective view of an illustrative housing showing how magnetic sensors may be attached to the housing in various orientations in accordance with an embodiment of the present invention.

As shown in FIG. 3, device 10 may include magnetic sensors 20 that are attached to portions of housing 12. In the example of FIG. 3, device 10 includes three unidirectional magnetic sensors 20 attached to housing sidewalls 12S and rear housing portion 12R. Each unidirectional magnetic sensor 20 may be aligned along a direction that is orthogonal to the other two sensors 20. For example, one sensor may have an elongated dimension that is aligned along the x-direction of FIG. 3, one sensor may have an elongated dimension that is aligned along the y-direction, and one sensor may have an elongated dimension that is aligned along the z-direction. In this way, the magnetic sensors, in combination, may be positioned so that they sample all orthogonal components of the Earth's magnetic field. However, this is merely illustrative. If desired, device 10 may include multi-directional magnetic sensors (e.g., sensors 20 with sensor elements configured to detect magnetic field components in two or three orthogonal directions).

Magnetic field data gathered using three sensors 20 or multiple sensor elements on one or two sensors 20 may be combined (e.g., using compass interface circuitry 32) to form directional compass data that includes information associated with the direction in which device 10 is oriented with respect to the Earth's magnetic field.

Magnetic sensors 20 may be relatively thin compared with conventional magnetometers. These thin magnetic sensors may be placed in locations within device 10 that are too small to accommodate a conventional compass chip. Sensors 20 may therefore be located on portions of housing 12 that are relatively far from magnetic field generating electronic components within housing 12.

Figure 4:
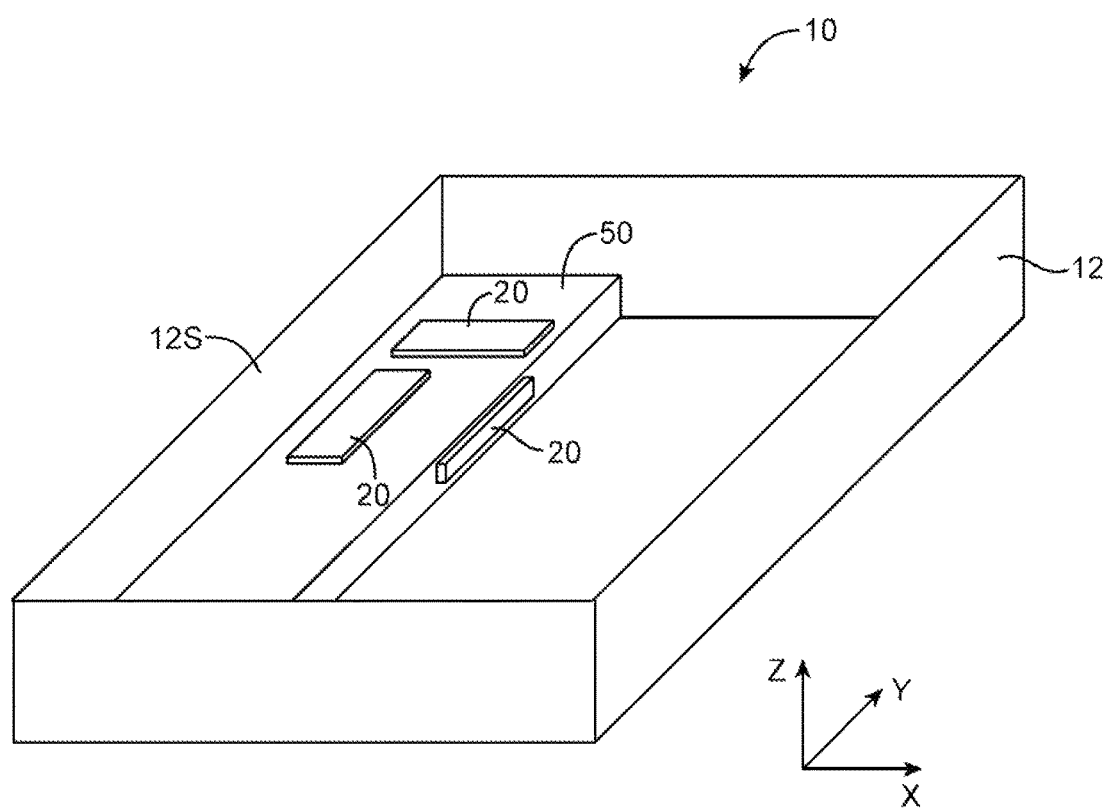
FIG. 4 is a perspective view of an illustrative electronic component in a device housing showing how magnetic sensors may be attached to the electronic component in various orientations in accordance with an embodiment of the present invention.

As shown in FIG. 4, one or more sensors 20 may be mounted to a structure such as component 50 within device 10. Component 50 may, for example, be a battery or other component in device 10 that generates relatively small magnetic fields (e.g., magnetic fields that minimally interfere with the detection of the Earth's magnetic field). The arrangements of FIGS. 3 and 4 are merely illustrative. If desired, sensors 20 may be mounted on other components within device 10, sensors 20 may include bidirectional magnetic sensors, sensors 20 may be mounted on a cover (cowling) structure for a component such as component 50, or some of sensors 20 may be mounted on portions of housing 12 while other sensors 20 are mounted on a structure such as component 50.

Figure 5:
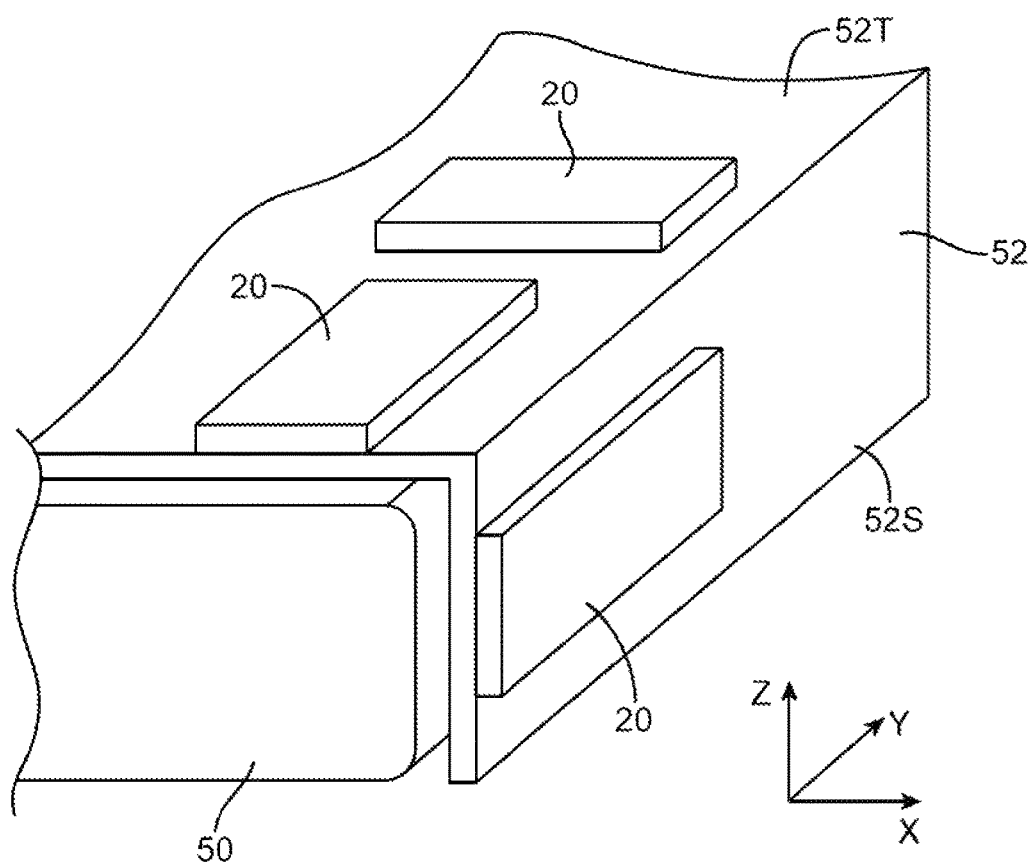
FIG. 5 is a perspective view of an illustrative set of magnetic sensors that are attached to a cowling structure that covers an electronic component in accordance with an embodiment of the present invention.

FIG. 5 is a perspective view of component 50 of device 10 showing how a mechanical cowling structure may be formed over at least part of component 50. In the example in which component 50 is a battery for device 10, component 50 may have some characteristics that make the surface of component 50 an undesirable location for mounting sensors 20. For example, a battery may have a curved outer surface or a battery may grow throughout the operating lifetime of a device thereby moving the location of the outer surface of the battery over time. For this reason, a cover structure such as cowling 52 may used to at least partially surround battery 50. In this way, a flat, stable surface may be provided on which sensors 20 can be mounted.

Cowling structure 52 may be formed from metal, plastic, glass, ceramic, composites or other suitable magnetically transparent rigid materials. If desired, structure 52 may include a top portion such as portion 52T that covers an extended top surface of battery 50 and a side portion 52S that is orthogonal to top portion 52T. Side portion 52S and top portion 52T may be formed from a common structure that has been folded or bent, or side portion 52S may be a separate structure that is attached to or mounted adjacent to top portion 52T.

As shown in FIG. 5, two sensors 20 may be mounted in orthogonal directions (e.g., parallel to the x and y directions of FIG. 5) on a top surface 52T and a third sensor 20 may be attached to an orthogonal folded side portion 52S of structure 52. However, this is merely illustrative.

Figure 6:
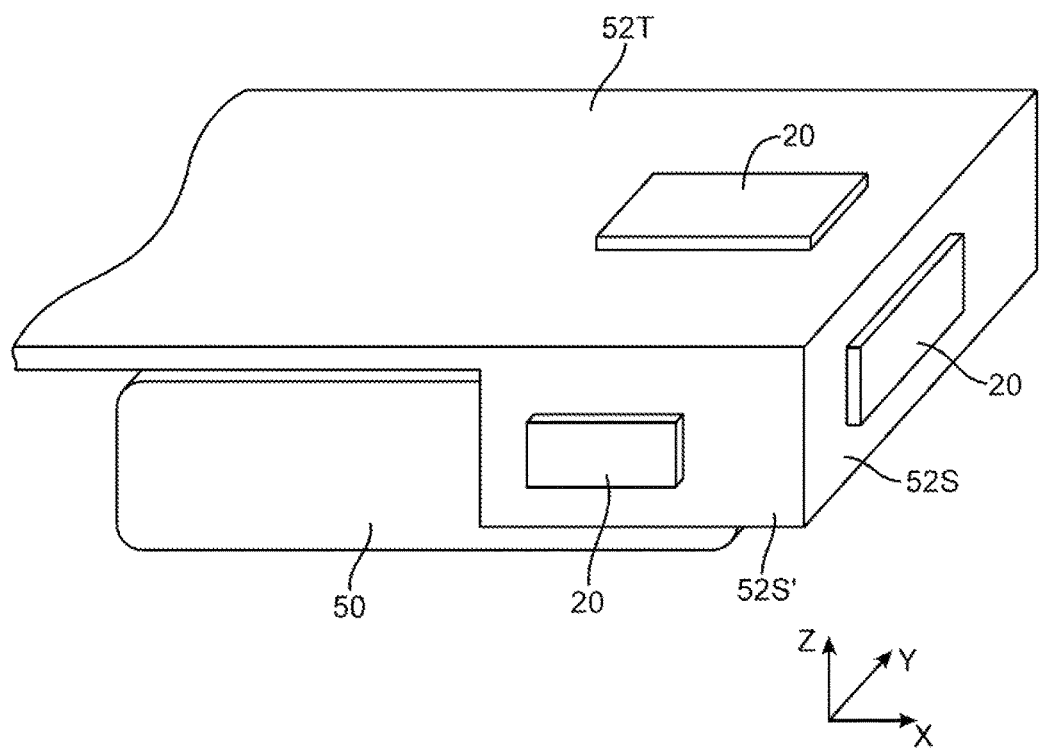
FIG. 6 is a perspective view of an illustrative set of magnetic sensors that are attached to a cowling structure having folded portions in multiple orientations that cover an electronic component in accordance with an embodiment of the present invention.

As shown in FIG. 6, structure 52 may include an additional side portion 52S' that is orthogonal to both sidewall portion 52 and top portion 52T. In this way, structure 52 may be provided with three orthogonal surfaces on which three unidirectional magnetic sensors 20 may be mounted.

Figure 7:
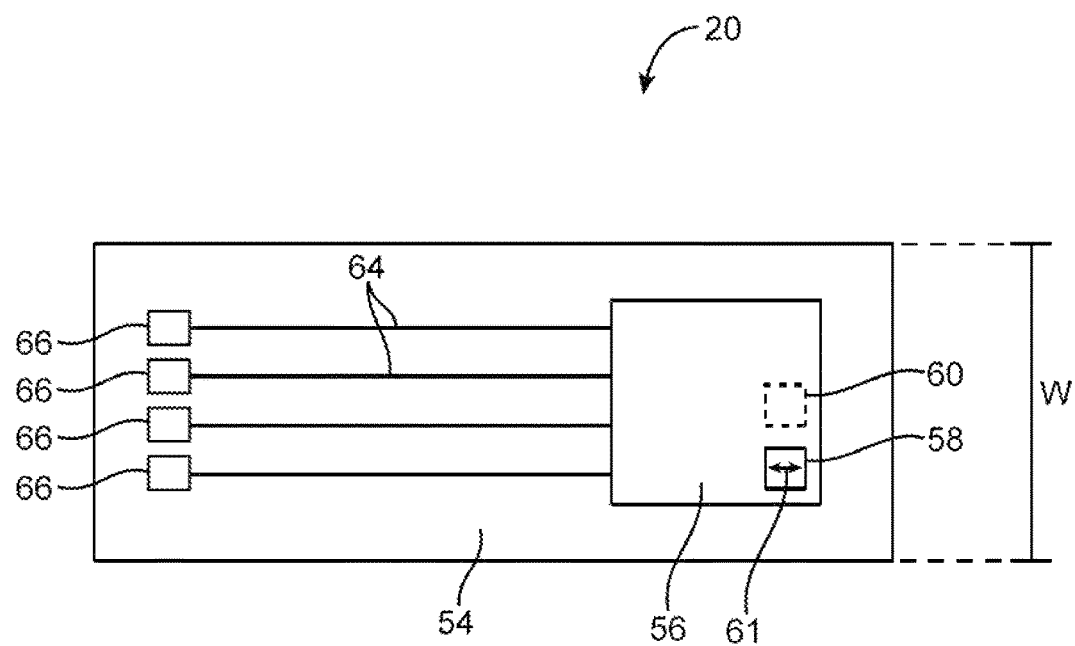
FIG. 7 is a top view of an illustrative unidirectional magnetic sensor in accordance with an embodiment of the present invention.

As shown in the top view of magnetic sensor 20 of FIG. 7, each sensor 20 may include a magnetic sensing element such as element 58 on a sensor circuitry substrate such as substrate 56. Sensing element 58 may be arranged so that magnetic fields that are aligned along the direction indicated by arrows 61 generate a response in sensing element 58 that can be detected by circuitry in substrate 56 or other circuitry in device 10. In this way, sensor 20 may be configured as a unidirectional magnetic sensor.

Circuitry substrate 56 may be encapsulated by a substrate material such as substrate 54 that includes conductive lines (traces) 64 and electrical contacts 66. Substrate 54 may be formed from a suitable flexible circuit material such as polyimide, a rigid substrate material such as a glass-infused epoxy, or other suitable materials or combinations of materials for electronic circuit fabrication. Substrate 56 may, for example, be a silicon substrate that includes circuitry for gathering magnetic field data based on magnetic field signals generated in magnetic sensing element 58.

Sensor 20 may have a lateral width W that is less than 2 mm, less than 1 mm, between 1 mm and 2 mm, between 0.5 mm and 1.5 mm, greater than 0.1 mm, or less than 5 mm. Magnetic sensing element 58 may have a lateral width that is less than 20 microns, less than 10 microns, less than 8 microns, between 10 microns and 20 microns, between 5 microns and 20 microns, greater than 0.5 microns, or less than 12 microns.

Electrical contacts 66 may be attached to a printed circuit board, to another flexible printed circuit, or to other circuitry within device 10. Traces 64 may be used to route magnetic field data from substrate 56 to other device circuitry such as compass interface circuitry 32 (FIG. 2).

In some situations, environmental changes other than magnetic fields (e.g., temperature changes) around magnetic sensor 20 may cause changes in magnetically sensitive material in magnetic sensing element 58. In order to help detect and remove noise signals due to these environmental changes, sensor 20 may be provided with a reference sensor element such as sensor element 60. Sensor element 60 may be formed using magnetically sensitive material as in sensing element 58 that is shielded from external magnetic fields such as the Earth's magnetic field. Changes in magnetic field signals from reference sensing element 60 may be removed from magnetic field signals gathered using sensing element 58.

Figure 8:
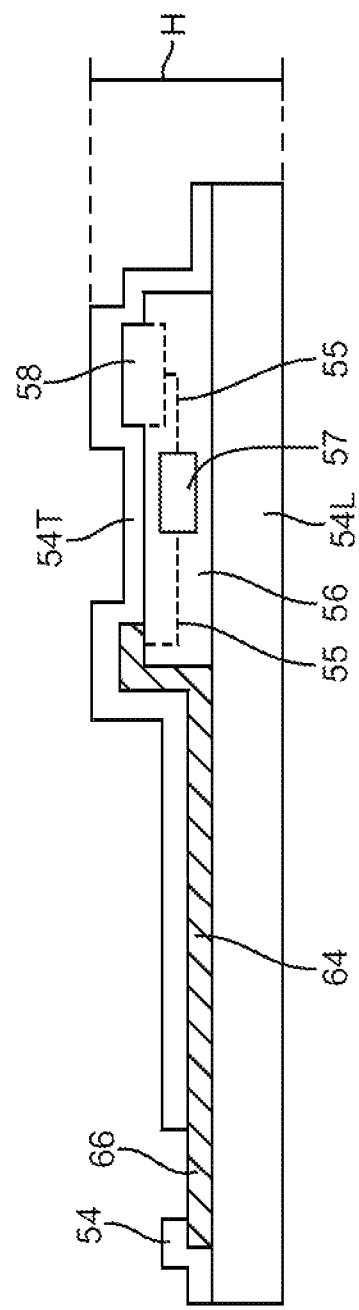
FIG. 8 is a cross-sectional side view of an illustrative unidirectional magnetic sensor in accordance with an embodiment of the present invention.

As shown in the cross-sectional side view of magnetic sensor 20 of FIG. 8, magnetic sensing element 58 may be formed on top of (or partially or completely embedded within) circuitry substrate 54. Substrate 56 may be mounted on a bottom layer of substrate 54L and may be covered by additional substrate material 54T.

Conductive traces 64 may be formed between top and bottom layers 54T and 54B of substrate material 54. Each conductive trace 64 may include an exposed portion (i.e., a portion that is substantially free of s material) that serves as a conductive contact 66. An opposing end of trace 64 may be coupled to conductive traces such as traces 55 in substrate 56, thereby coupling magnetic sensing element 58 to contacts 66. Conductive traces 64 may be formed from a magnetically transparent material such as copper so that traces 64 do not interfere with magnetic fields in the vicinity of sensor 20.

Substrate 56 may include circuitry such as circuitry 57 for processing magnetic field signals received from magnetic sensing element 58. For example, in configurations in which substrate 56 is provided with one or more magnetic sensing elements 58 and one or more reference sensing elements 60, circuitry 57 may be used to modify magnetic field signals from element(s) 58 using magnetic field signals from element(s) 60 (e.g., by removing effects due to changes in the temperature of substrate 56 from magnetic field signals gathered by the element(s) 58). However, this is merely illustrative. If desired, magnetic field signals from elements 58 and 60 may be provided to additional circuitry such as processing circuitry 40 (FIG. 2) without modifications.

Sensor 20 may be a relatively thin sensor having a characteristic maximum height H along a dimension that is perpendicular to a surface of sensor 20 and passes through substrate 56 and element 58. As examples, height H may be less than 150 microns, less than 100 microns, less than 80 microns, between 80 and 150 microns, between 50 and 100 microns, or between 40 and 200 microns.

Sensors 20 may be provided with this type of thin height H by, for example, forming a magnetic sensor on a substrate, attaching a temporary carrier to the substrate, back-thinning the substrate (e.g., by etching a backside of the substrate that is opposite to the side on which the magnetic sensor is formed), removing the temporary carrier (e.g., by chemically detaching the carrier or releasing the carrier using ultraviolet radiation), and encapsulating the back-thinned substrate in flexible printed circuit material. However, this is merely illustrative. Sensor 20 may be formed using any suitable combination of these steps, or other suitable packaging techniques.

Figure 9:
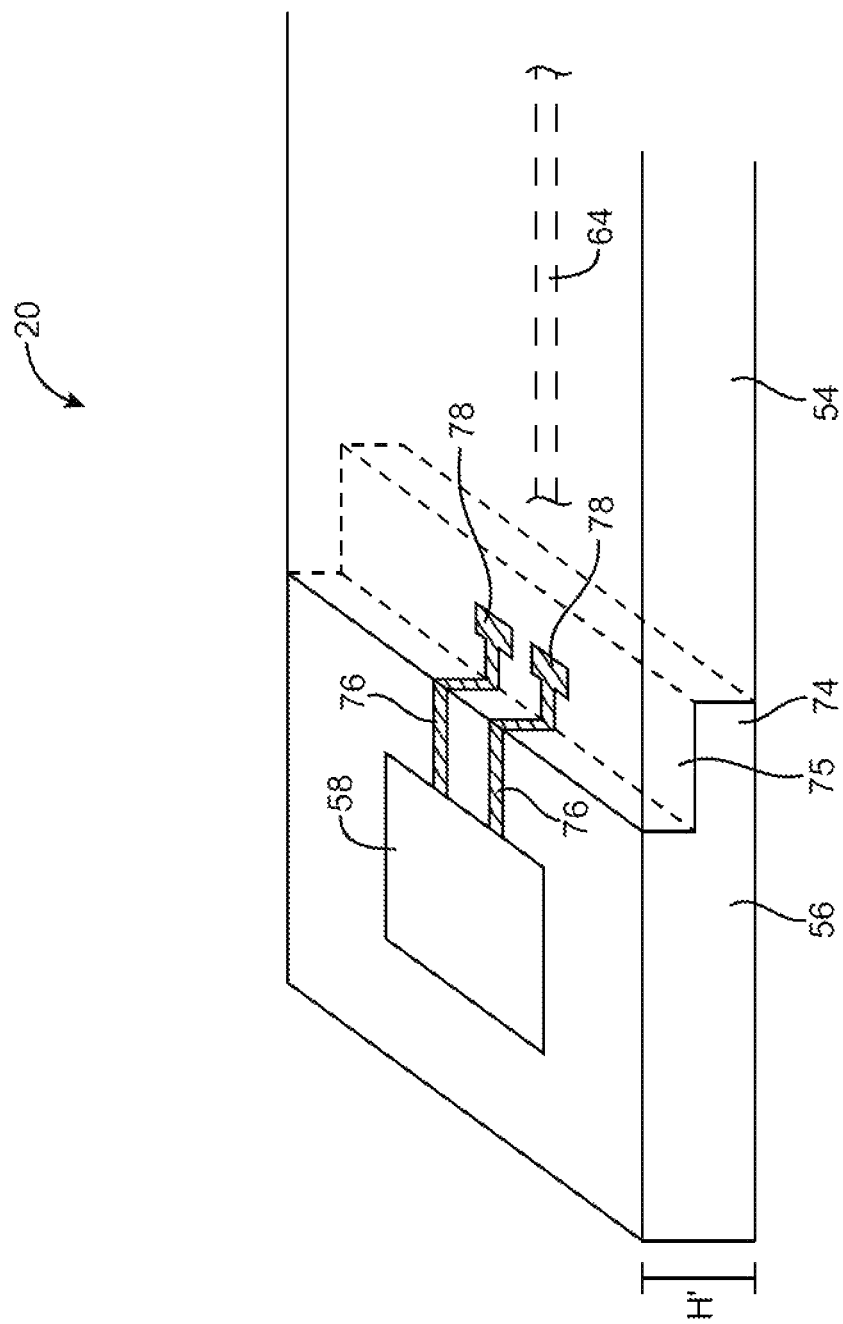
FIG. 9 is a perspective view of an illustrative unidirectional magnetic sensor having a stepped edge for low-profile coupling to a flexible circuit in accordance with an embodiment of the present invention.

If desired, the height of sensor 20 may be further reduced, for example, by providing substrate 56 with a recessed portion for receiving printed circuit 54, as shown in FIG. 9. In the example of FIG. 9, a portion of substrate 56 has been removed so that extended portion 74 of substrate 56 can interface with an extended portion such as portion 75 of substrate 54. In this way, substrate 56 may be provided without any top layer of printed circuit material.

In a configuration of the type shown in FIG. 9, substrate 56 may be provided with conductive traces (e.g., copper traces) 76 that extend from magnetically sensitive element 58 onto extended portion 74 and connect to electrical contacts 78 on extended portion 74. Electrical contacts 78 may be coupled to traces 64 in substrate 54. However, this is merely illustrative. If desired, conductive traces within substrate 56 may couple sensor element 58 to circuitry within substrate 56 and/or to contacts 78.

By providing substrate 54 and substrate 56 of sensor 20 with interfacing extended portions of the type shown in FIG. 9, the height of sensor 20 may be reduced to a height H' that is less than 80 microns, less than 60 microns, less than 50 microns, between 50 and 100 microns, between 50 and 150 microns, or between 30 and 150 microns.

Figure 10:
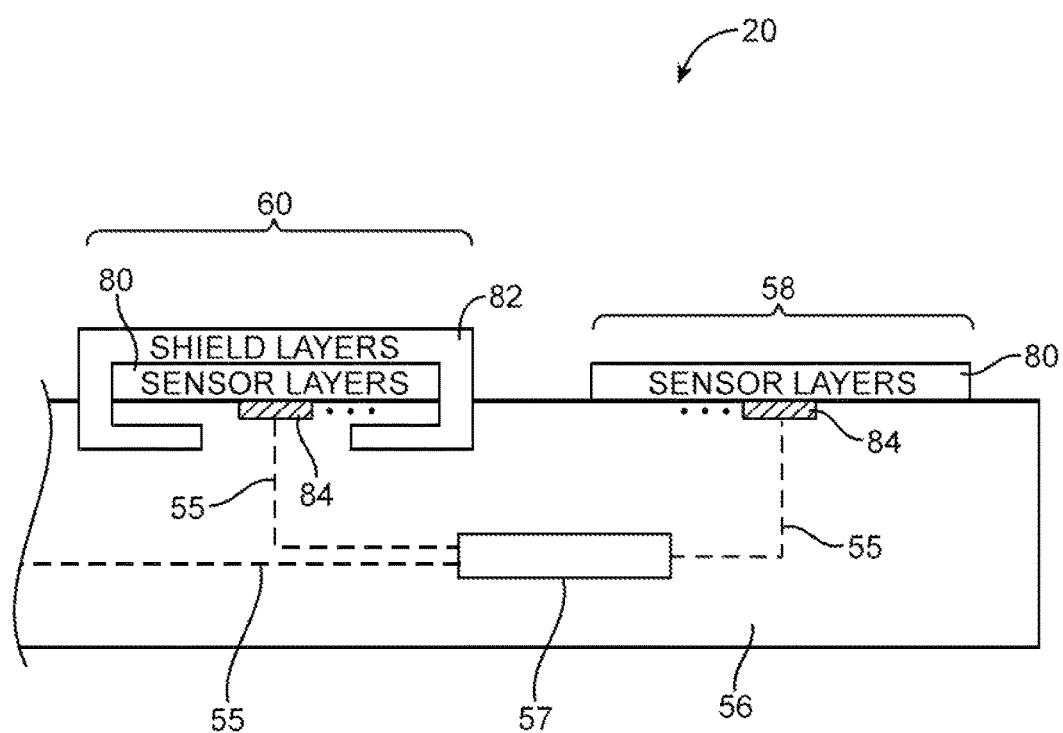
FIG. 10 is a cross-sectional side view of an illustrative magnetic sensor having a reference sensor element in accordance with an embodiment of the present invention.

FIG. 10 is a cross-sectional side view of a magnetic sensor such as sensor 20 showing how magnetic sensor element 58 and reference sensor element 60 may be formed on a common surface of substrate 56. Substrate 56 may include electrical contacts 84 (e.g., exposed portions of a conductive metal layer in substrate 56) that are coupled to elements 58 and 60 and circuitry 57. Conductive lines 55 may be used to provide magnetic field data from elements 58 and 60 to circuitry 57 and/or to conductive traces 64 of printed circuit 54.

As shown in FIG. 10, both magnetic sensor element 58 and reference sensor element 60 may include magnetic sensor layers 80. Magnetic sensor layers 80 may include a layer of magnetically sensitive material such as magneto-resistive materials or materials in which voltage differences may be induced by magnetic fields. Magnetic sensor layers may include other layers such as passivation layers, shielding layers, conductive layers, etc.

Reference sensor 60 may include one or more additional shielding layers 82 that cover magnetic sensor layers 80 and prevent external magnetic fields from reaching sensor layer 80 in the reference sensor. Shield layer 82 may be formed from magnetically shielding materials such as mu-metals, nickel, or other suitable magnetic field shielding materials or combinations of materials. As shown in FIG. 10, if desire, shielding layers 82 may extend under a portion of sensor layers in substrate 56.

In the example of FIG. 10, sensor 20 includes one magnetic sensor element 58 and one reference sensor element 60. However, this is merely illustrative. If desired, sensor 20 may be provided without any reference sensors, or sensor 20 may be provided with more than one magnetic sensor element and/or more than one reference sensor element.

Figure 11:
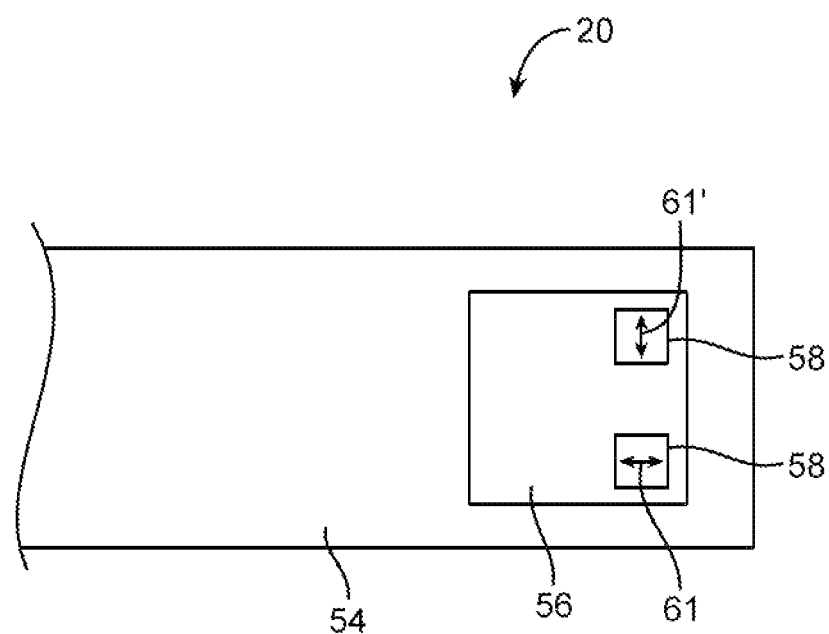
FIG. 11 is a top view of an illustrative bidirectional magnetic sensor in accordance with an embodiment of the present invention.

As shown in FIG. 11, sensor 20 may be provided with two magnetic sensor elements. Sensor 20 may include a first sensor element 58 that is configured to detect magnetic field components along a direction parallel to arrows 61 and a second sensor element 58 that is configured to detect magnetic field components along an orthogonal direction that is parallel to arrows 61'. In this way, sensor 20 may be configured as bidirectional magnetic field sensor (i.e., a sensor that can detect magnetic field components in two orthogonal directions).

Figure 12:
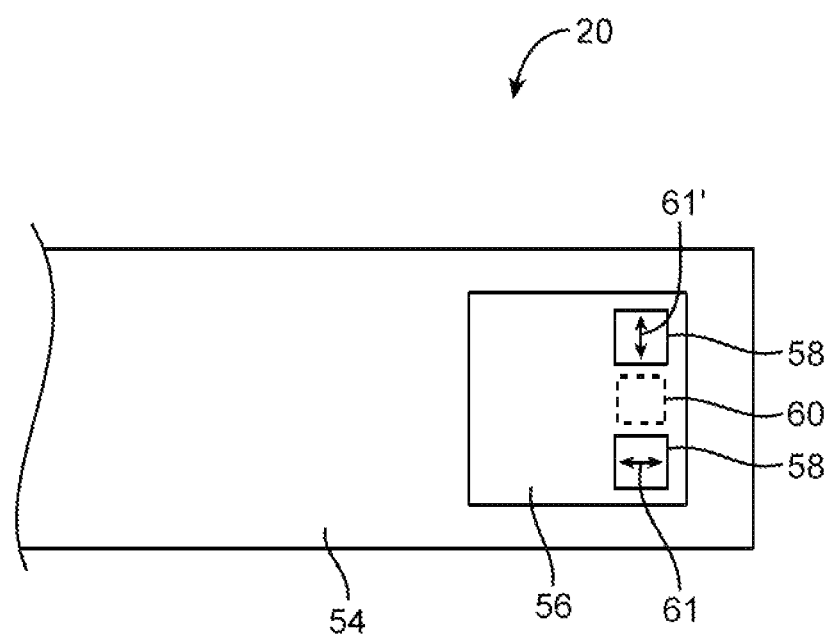
FIG. 12 is a top view of an illustrative bidirectional magnetic sensor with a shared reference sensor element in accordance with an embodiment of the present invention.

As shown in FIG. 12, a bidirectional magnetic field sensor 20 may also include a shared reference sensor 60. Signals from a first sensor element 58 and element 60 may be combined (e.g., subtracted) and digitized (e.g., using circuitry 57 in substrate 56 or other circuitry in device 10). Signals from a second sensor element 58 and element 60 may be combined (e.g., subtracted) and digitized (e.g., using circuitry 57 in substrate 56 or other circuitry in device 10). If desired, combined signals from each sensor 58 and the shared reference sensor element 60 may be digitized using a common, shared analog-to-digital converter circuit. However, the example of FIG. 12 in which sensor 20 is implemented as a bidirectional magnetic sensor having a shared reference sensor is merely illustrative.

Figure 13:
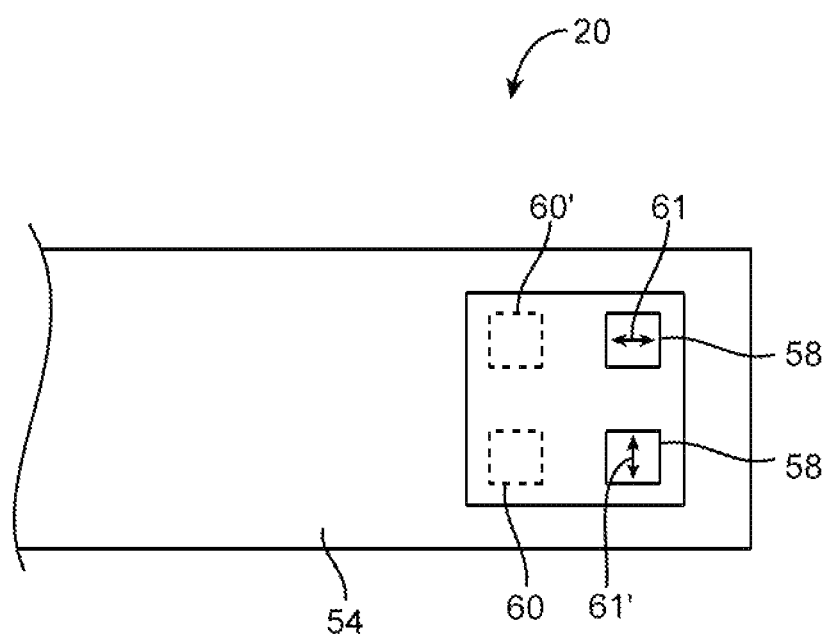
FIG. 13 is a top view of an illustrative bidirectional magnetic sensor with multiple reference sensor elements in accordance with an embodiment of the present invention.

As shown in FIG. 13, sensor 20 may be implemented as a bidirectional magnetic sensor with multiple reference magnetic sensor elements 60. If desired, magnetic field signals from each magnetic sensor element 58 may be modified (corrected) using magnetic field signals from an associated reference sensor element 60 on substrate 56.

Figure 14:
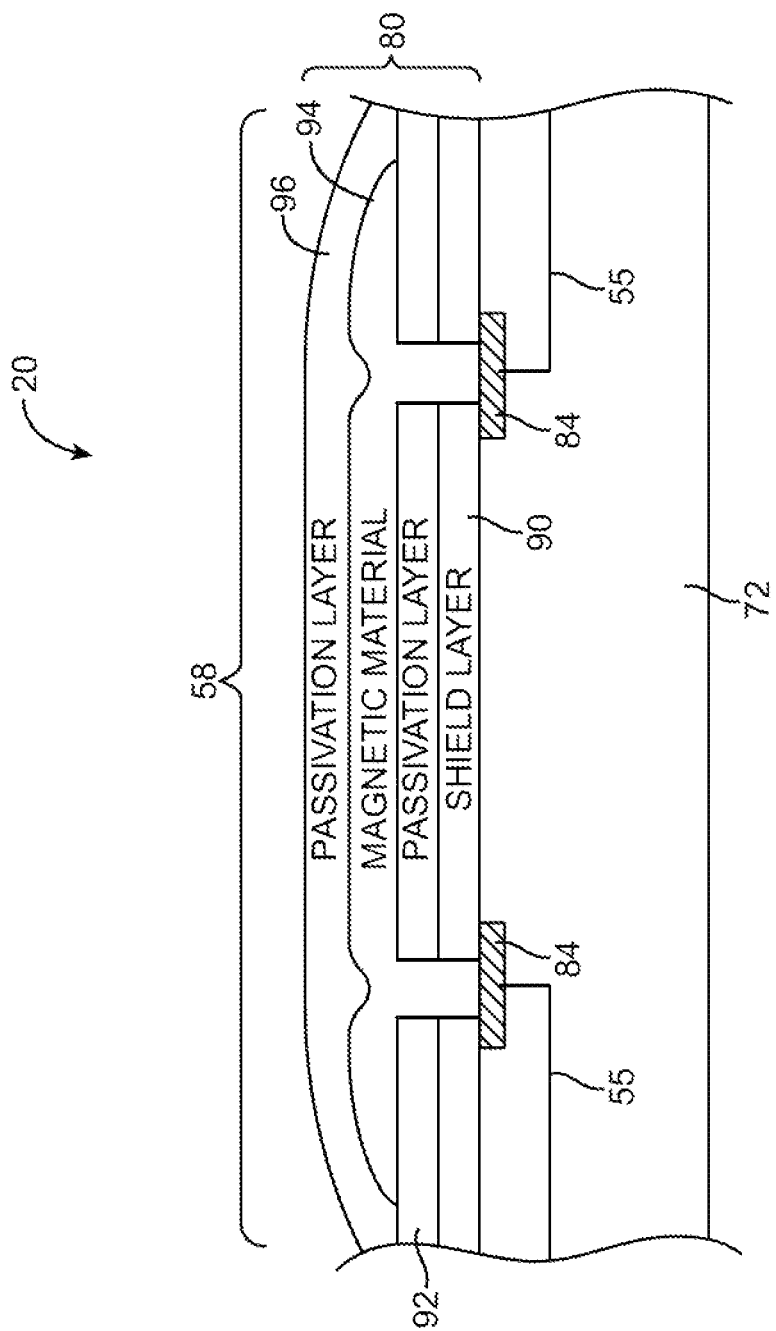
FIG. 14 is a cross-sectional side view of an illustrative magnetic sensor element showing how magnetic sensor layers in the magnetic sensor element may include passivation layers and a layer of magnetically sensitive material in accordance with an embodiment of the present invention.

FIG. 14 is a cross-sectional side view of a portion of magnetic sensor 20 showing various layers that may be used to form sensor layers 80 of magnetic sensor element 58. As shown in FIG. 14, sensor layers 80 may include shield layer 90 formed on a surface of substrate 56. Shield layer 90 may be formed from a magnetically shielding material such as mu-metal or nickel. If desired, shield layer 90 may be electrically isolated from contacts 84 (e.g., by including an insulating layer or an insulating coating between layer 90 and contacts 84). Passivation layer 92 may be formed over shield layer 90. Passivation layer 92 may be formed from any suitable dielectric material such as a vapor deposited dielectric or other dielectric material.

A layer of magnetically sensitive material such as ferro-magnetic material, magneto-resistive material, Hall-effect material, or other magnetically sensitive material may be formed over shield layer 90 and passivation layer 92. Shield layer 90 and passivation layer 92 may be provided with openings that allow magnetic material 94 to be formed in contact with electrical contacts 84 on substrate 56. Magnetic fields may be detected by, for example, detecting changes in current that flows through material 94 from a first contact 84 to a second contact 84.

A second (upper) passivation layer 96 may be formed over magnetic material 94 that substantially covers material 94.

Figure 15:
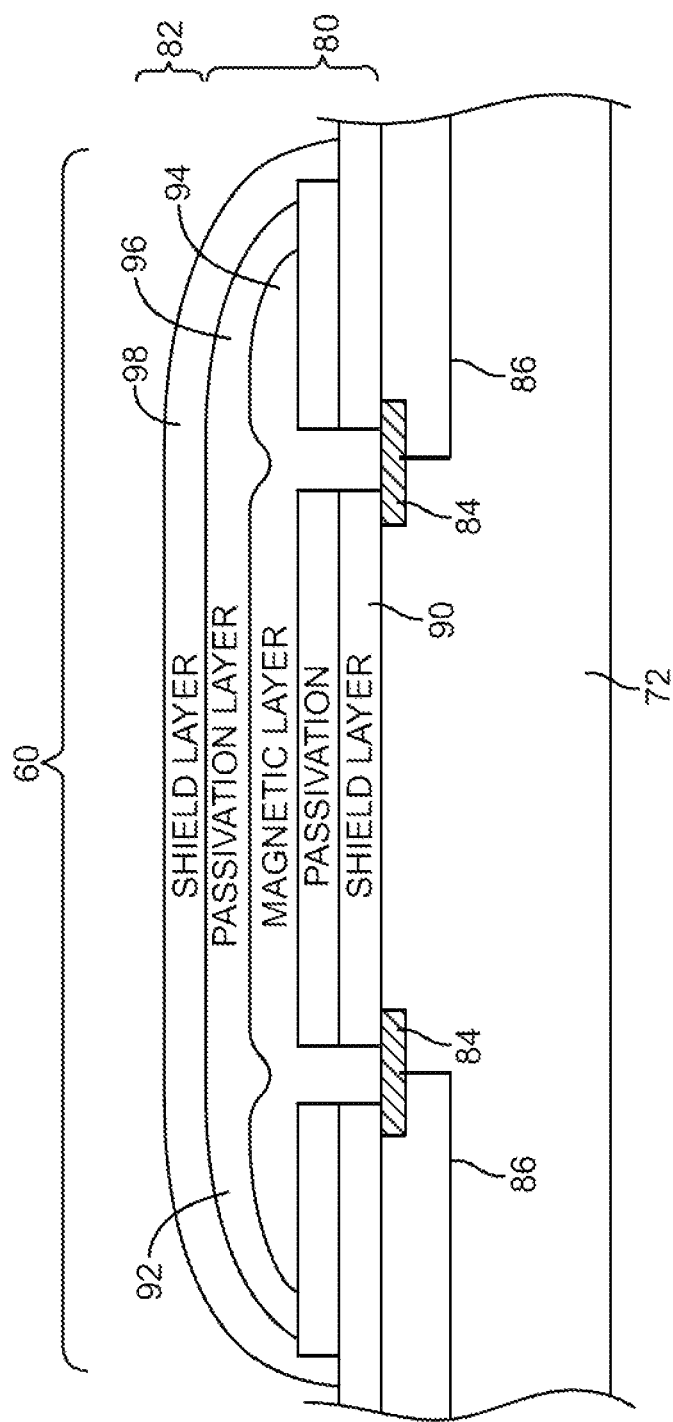
FIG. 15 is a cross-sectional side view of an illustrative reference magnetic sensor element showing how magnetic sensor layers in the reference sensor may be covered by an additional shield layer in accordance with an embodiment of the present invention.

As shown in FIG. 15, a reference magnetic field sensor element 60 may be formed by forming an additional layer of magnetically shielding material such as shield layer 98 over passivation layer 96. In this way, magnetic material 94 of element 60 may be surrounded by magnetically shielding material and thereby prevented from being affected by external magnetic fields.

The examples in the preceding figures in which one or more magnetic sensor elements 58 and one or more reference sensor elements 60 are formed separately on a surface of substrate 56 are merely illustrative. If desired, elements 58 and elements 60 may be formed having other configurations on the surface of substrate 56 or may be partially or completely embedded within substrate 56.

Figure 16:
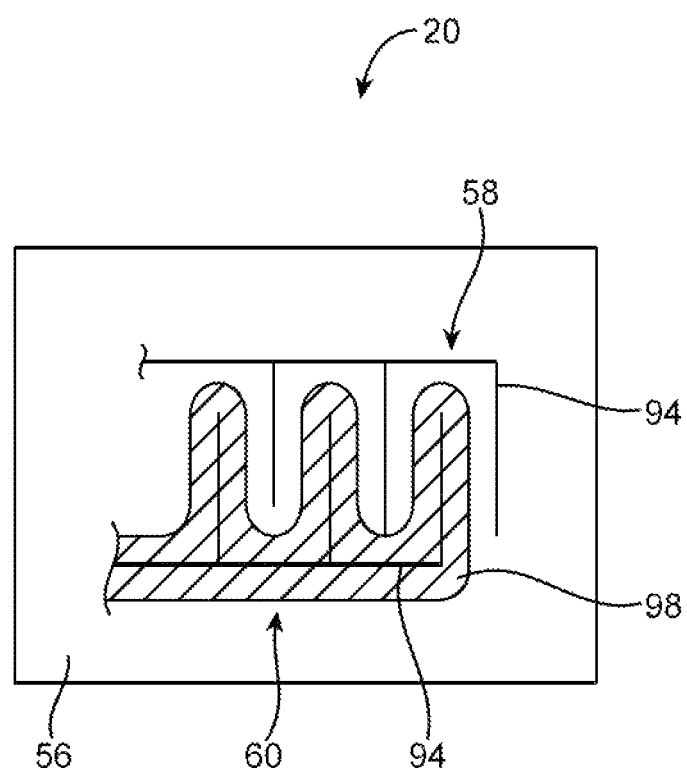
FIG. 16 is a top view of an illustrative magnetic sensor showing how a magnetic sensor element and a reference sensor element may be interleaved on the surface of a substrate in accordance with an embodiment of the present invention.

In the example of FIG. 16, sensor 20 includes a magnetic sensor element 58 and a reference sensor element 60 that are interleaved on the surface of substrate 56. An interleaved pair of sensor elements 58 and 60 of this type may be formed by forming an interleaved pattern of magnetic material 94 on substrate 56 (or on a passivation layer on substrate 56) and forming shielding material 98 over a portion of the interleaved magnetic material 94.

Figure 17:
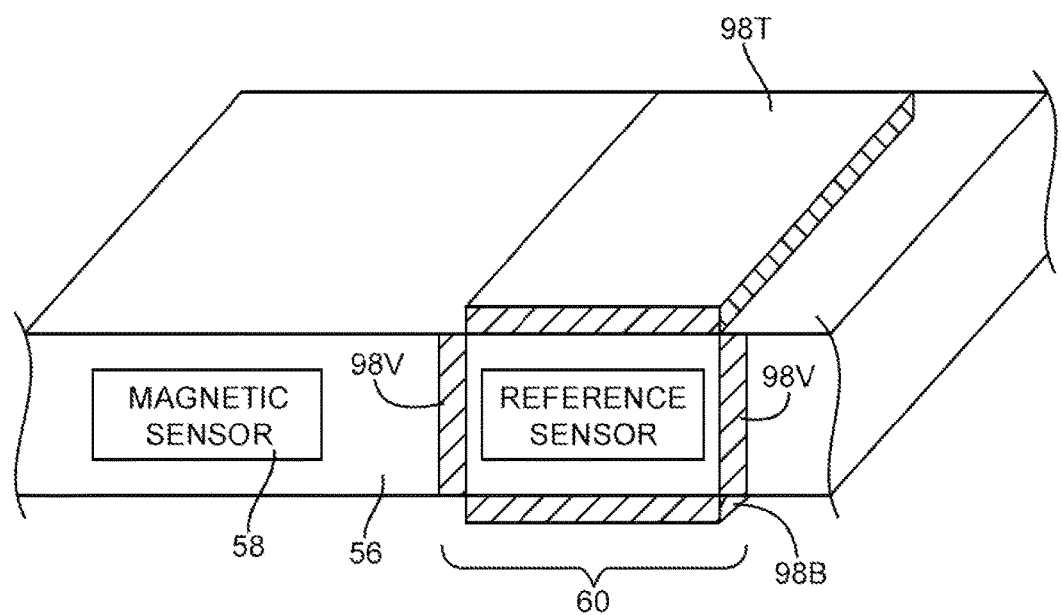
FIG. 17 is a cross-sectional perspective view of an illustrative magnetic sensor showing how a magnetic sensor element and a reference sensor element may be embedded in a substrate in accordance with an embodiment of the present invention.

In the example of FIG. 17, magnetic sensor element 58 and reference sensor element 60 are embedded within substrate 56. In this type of configuration, sensor element 58 and sensor element 60 may be formed from a patterned layer of magnetically sensitive material that forms a portion of a layer within substrate 56. Reference sensor element 60 may be partially or completely surrounded by shielding material 98. Shielding material 98 may include a top shielding layer 98T formed on a top surface of substrate 56, a bottom shielding layer formed on an opposing bottom surface of substrate 56 and embedded vertical shielding layers 98V that extend from the top surface to the opposing bottom surface of substrate 56.

Vertical shielding layers 98V may be formed by forming openings in substrate 56 (e.g., by laser drilling or mechanical drilling) and filling the openings with magnetically shielding material (e.g., mu-metal). Vertical shielding layer 98V may be formed in contact with top shield layer 98T and bottom shield layer 98B so that magnetically sensitive material in reference sensor element 60 is surrounded by shielding material so that the magnetically sensitive material is blocked from exposure to external magnetic fields.

Figure 18:
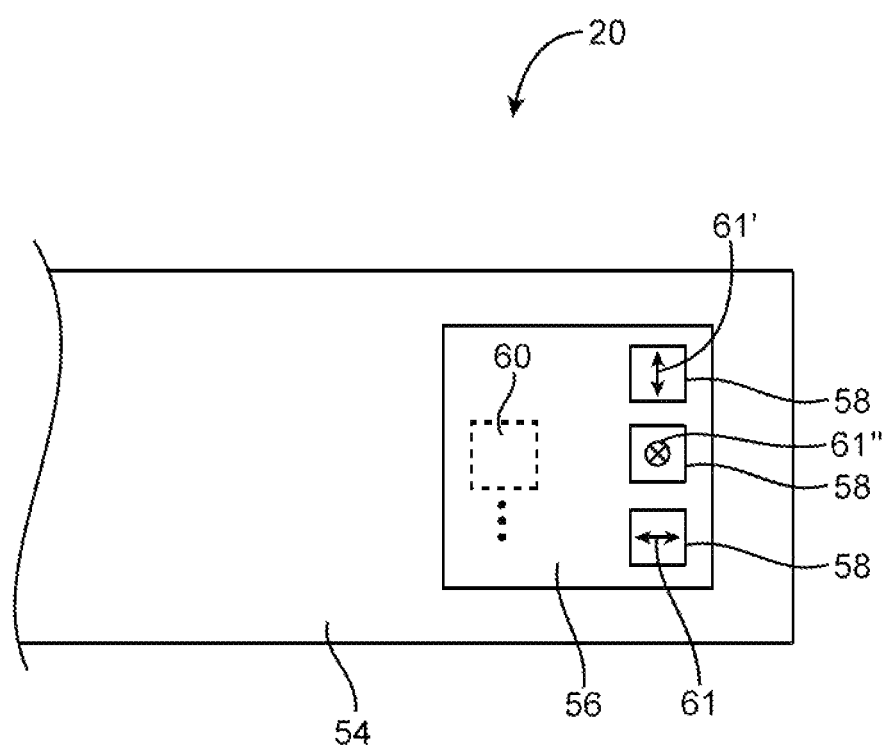
FIG. 18 is a top view of an illustrative tri-directional magnetic sensor with an optional shared reference sensor element in accordance with an embodiment of the present invention.

As shown in FIG. 18, sensor 20 may be provided with three magnetic sensor elements. Sensor 20 may include a first sensor element 58 that is configured to detect magnetic field components along a direction parallel to arrows 61, a second sensor element 58 that is configured to detect magnetic field components along an orthogonal direction that is parallel to arrows 61', and a third sensor element 58 that is configured to detect magnetic field components along another orthogonal direction that is parallel to arrow 61". In this way, sensor 20 may be configured as tri-directional (three-axis) magnetic field sensor (i.e., a sensor that can detect all components of a magnetic field in three orthogonal directions).

If desired, a tri-directional magnetic field sensor of the type shown in FIG. 18 may include one or more reference magnetic sensor elements such as reference sensor element 60. Reference sensor element 60 may be a shared reference sensor 60 for two or more of sensor elements 58 (i.e., reference signals from sensor element 60 may be used to correct magnetic field signals from more than one of sensor elements 58) or sensor 20 may include three reference sensor elements 60 each of which is used to correct magnetic field signals from an associated one of sensor elements 58. If desired, combined signals from each sensor 58 and a shared reference sensor element 60 may be digitized using a common, shared analog-to-digital converter circuit.

The foregoing is merely illustrative of the principles of this invention and various modifications can be made by those skilled in the art without departing from the scope and spirit of the invention.

What is claimed is:

1. A magnetic sensor, comprising:
   a silicon substrate;
   a magnetic sensor element on the silicon substrate having a material that responds to a magnetic field;
   a reference magnetic sensor element on the silicon substrate having a shield that prevents magnetic material in the reference magnetic sensor from being exposed to the magnetic field; and
   a polyimide substrate that encapsulates the silicon substrate and the magnetic sensor element, wherein the polyimide substrate comprises a top layer and a bottom layer, and wherein the silicon substrate is interposed between the top layer and the bottom layer.

2. The magnetic sensor defined in claim 1 wherein the magnetic sensor has a maximum height along a direction that is perpendicular to a surface of the silicon substrate and passes through the silicon substrate and the magnetic sensor element and wherein the maximum height is less than 150 microns.

3. The magnetic sensor defined in claim 1 wherein the magnetic sensor element includes a portion that is interleaved with a portion of the reference magnetic sensor element on a surface of the silicon substrate.

4. The magnetic sensor defined in claim 1, wherein the silicon substrate is in direct contact with the top layer and the bottom layer.

5. The magnetic sensor defined in claim 1, further comprising:
   conductive traces formed between the top layer and the bottom layer such that the conductive traces are in direct contact with the top layer and the bottom layer.

6. The magnetic sensor defined in claim 1, wherein the silicon substrate comprises a back-thinned silicon substrate.

7. The magnetic sensor defined in claim 1, further comprising:
   circuitry on the silicon substrate that is configured to modify magnetic field signals from the magnetic sensor element using magnetic field signals from the reference magnetic sensor element.

8. The magnetic sensor defined in claim 7, further comprising:
   conductive traces formed between the top layer and the bottom layer;
   additional conductive traces in the silicon substrate that couple the circuitry to the conductive traces.

9. The magnetic sensor defined in claim 8, wherein the conductive traces have a first portion that is interposed between and in direct contact with the top layer and the bottom layer of the polyimide substrate, and wherein the conductive traces have a second portion that is not in direct contact with the top layer and forms an exposed conductive contact.

10. The magnetic sensor defined in claim 1, further comprising:
    an additional magnetic sensor element on the silicon substrate, wherein the magnetic field has a first component that is oriented in a first direction and a second component that is oriented in a second direction that is orthogonal to the first direction, wherein the magnetic sensor element is configured to detect the first component of the magnetic field, and wherein the additional magnetic sensor element is configured to detect the orthogonal second component of the magnetic field.

11. The magnetic sensor defined in claim 10, further comprising:
    circuitry on the silicon substrate that is configured to modify magnetic field signals from the magnetic sensor element using magnetic field signals from the reference magnetic sensor element and to modify magnetic field signals from the additional magnetic sensor element using the magnetic field signals from the reference magnetic sensor element.

12. The magnetic sensor defined in claim 10, further comprising:
    an additional reference magnetic sensor element on the silicon substrate.

13. The magnetic sensor defined in claim 1 wherein the magnetic sensor element and the reference magnetic sensor element are at least partially embedded in the silicon substrate.

14. The magnetic sensor defined in claim 13 wherein the shield includes a first portion on a first surface of the silicon substrate, a second portion on an opposing second surface of the silicon substrate, and vertical portions that extend through the silicon substrate from the first surface to the opposing second surface.

15. An electronic device, comprising:
    a housing;
    a display in the housing;
    first, second and third unidirectional magnetic sensors in the housing that are configured to detect respective first, second, and third orthogonal components of a magnetic field;
    circuitry coupled to the first, second, and third unidirectional magnetic sensors that is configured to combine magnetic field data gathered using the first, second, and third unidirectional magnetic sensors to form compass data; and
    a battery, wherein the battery has a top surface and a side surface that is perpendicular to the top surface, wherein the first and second unidirectional magnetic sensors are mounted directly to the top surface of the battery, and wherein the third unidirectional magnetic sensor is mounted directly to the side surface of the battery.

* * * * *